(12) United States Patent
Tan (10) Patent No.: US 7,642,798 B2
(45) Date of Patent: Jan. 5, 2010

(54) PROBE CARD NEEDLE CLEANING FREQUENCY OPTIMIZATION

(75) Inventor: Beng Ghee Tan, Singapore (SG)

(73) Assignee: Systems on Silicon Manufacturing Co. Pte. Ltd., Singapore (SG)

( * ) Notice: Subject to any disclaimer, the term of this patent is extended or adjusted under 35 U.S.C. 154(b) by 950 days.

(21) Appl. No.: 10/542,278

(22) PCT Filed: Feb. 5, 2003

(86) PCT No.: PCT/SG03/00023

§ 371 (c)(1),
(2), (4) Date: Jul. 14, 2005

(87) PCT Pub. No.: WO2004/070405

PCT Pub. Date: Aug. 19, 2004

(65) Prior Publication Data

US 2006/0144423 A1   Jul. 6, 2006

(51) Int. Cl.
    *G01R 31/26*   (2006.01)
(52) U.S. Cl. .................................. 324/765
(58) Field of Classification Search .............. None
    See application file for complete search history.

(56) References Cited

U.S. PATENT DOCUMENTS

| | | | |
|---|---|---|---|
| 4,342,958 A * | 8/1982 | Russell | 324/754 |
| 5,495,578 A * | 2/1996 | Rohrbaugh et al. | 714/51 |
| 6,118,894 A * | 9/2000 | Schwartz et al. | 382/151 |
| 6,218,848 B1 * | 4/2001 | Hembree et al. | 324/754 |
| 6,352,868 B1 * | 3/2002 | Yang | 438/14 |
| 6,573,702 B2 * | 6/2003 | Marcuse et al. | 324/158.1 |
| 6,777,966 B1 * | 8/2004 | Humphrey et al. | 324/757 |
| 6,807,109 B2 * | 10/2004 | Tomishima | 365/189.05 |
| 7,084,650 B2 * | 8/2006 | Cooper et al. | 324/754 |

* cited by examiner

*Primary Examiner*—Ha Tran T Nguyen
*Assistant Examiner*—Roberto Velez
(74) *Attorney, Agent, or Firm*—Harness, Dickey & Pierce, P.L.C.

(57) ABSTRACT

A system and method for optimizing cleaning of a probe card including using the probe card to test the functionality of dies on a wafer, when a die fails the probe test, and the probe reports failure to contact the pads of the die, checking the resistance of the probe needles, and if the resistance of a probe needle is greater than a predetermined value triggering probe needle cleaning.

34 Claims, 5 Drawing Sheets

Figure 4 s16388.1_06.20021001011407                                                  Top

| Device: | TMF105_vr1 | | | Tester: | D342X | | |
|---|---|---|---|---|---|---|---|
| Lot ID: | s16388.1 | Board Num: | 1 | Touchdown: | 1072 | PMU Measure: | 5 |
| Wafer ID: | 06 | Probe Card: | 3 | Indexing: | 987 | Cleaning: | 2 |
| Operator ID: | 1058 | Test Mode: | 0 | Good Die: | 898 | Recovery: | 3 |
| Timestamp: | 20021001011407 | | | RRR: | 0.33 | | |

| Bin to Bin Recovery | Count | % | | Top 10 CRC Fail Pins | Count | % |
|---|---|---|---|---|---|---|
| IDD_FAIL(7) -> SCAN_SP_FAIL(16) | 1 | 0.11 | | xo(73) | 2 | 40.00 |
| BIST_NOM_FAIL(8) -> GOOD(1) | 1 | 0.11 | | pll0(11) | 2 | 40.00 |
| OPEN_FAIL(2) -> GOOD(1) | 1 | 0.11 | | gclk1(2) | 2 | 40.00 |
| AMCLK(19) -> GOOD(1) | 1 | 0.11 | | gclk(1) | 2 | 40.00 |
| FAIL -> GOOD | 3 | 0.34 | | | | |

Figure 5

PROBE CARD NEEDLE CLEANING FREQUENCY OPTIMIZATION

FIELD OF INVENTION

The invention relates to a system for optimizing the cleaning frequency of needles on a probe card used to test dies on wafers.

BACKGROUND

In wafer manufacture probing is a process for testing if dies formed on a wafer are functional. Probing dies on a wafer involves penetrating the surface of the wafer at predetermined points to make contact with the pads of each die. The probe uses probe needles to make contact with the pads of each die. Once the probe has penetrated the surface of the die an electronic signal is passed through the die from at least one probe needle to at least one other probe needle. Information received from the probe needle(s) is used to determine the functionality of the die.

Problems may arise in the probing process due to a number of different reasons. These reasons include dirt being trapped on the probing needles, surface residue building up on the probing needles, and the probing needles becoming bent out of shape.

There are two types of dirt that affect probe needles, gradual material build-up on the needles and sudden dirt build-up. The gradual build-up occurs over a period of time of prolonged usage of the probe card. This build-up may include oxide and pad residue that remain on the probe card after scrubbing. This build-up gradually increases the resistance of the needle in a stable manner. The resistance is not easily noticeable.

The second type of build-up is the sudden build-up. This occurs when a probe needle picks up dirt during the testing process. Sudden dirt build-up leads to an increase in resistance of the needle. Sudden dirt build-up may be caused by foreign particles such as dust, fibre and other airborne particles.

At present probe needles are cleaned after testing a set number of die for example 50. If the number of dies between needle cleaning is too great then a number of good die may fail the probing process due to dirty probe needles. For example in the 50 die cleaning interval could mean that 49 dies are tested by a probe with dirty probe needles before the dust is cleaned away. If the number of die between needle cleanings is too low then the needles may be cleaned excessively leading to a slower testing process and more wear and tear on the needles. The present cleaning regime is ineffective against sudden build-up, which may lead to a large number of good dies failing the probing test.

SUMMARY OF INVENTION

It is the object of the invention to provide an optimized process for cleaning probing cards or to at least provide the public with a useful choice.

In broad terms in one aspect the invention comprises a method for optimizing cleaning of a probe card including:
  using the probe card to test the functionality of dies on a wafer;
  when a die fails the probe test and the probe reports failure to contact the pads of the die assessing an electrical characteristic of the probe needles; and
  if the electrical characteristic of a probe needle is greater than a predetermined value triggering probe needle cleaning.

The characteristic of the probe needle may be the voltage of the probe needle or the resistance of the probe needle.

Probe needle cleaning may be performed by a separate device.

In the method above a tester module may control the probe and probe module. In this embodiment the tester module may be arranged to assess whether the probe test is a pass or a fail.

Preferably if the test is a fail the tester module is further arranged to determine whether or not to skip the die.

Preferably the tester module is further arranged to re-probe the die if the die is not skipped.

If the re-probe produces a fail result, preferably the tester module is further arranged to assess whether the maximum number of dies per clean has been exceeded.

Preferably the tester module is further arranged to trigger cleaning of the probe needles if the maximum number of dies per clean has been exceeded.

If the maximum number of dies per clean has not been exceeded the tester module is preferably arranged to assess whether the number of dies tested since the last clean is less than a set minimum number of dies before a clean.

If the number of dies tested since the last clean is less than a set minimum number of dies before a clean the tester module is preferably arranged to skip to the next die.

If the number of dies tested since the last clean is greater than a set minimum number of dies before a clean preferably the tester module is further arranged to assess whether the maximum number of cleans per wafer has been exceeded. If the maximum number of cleans per wafer has been exceeded the tester is preferably arranged to instruct the probe to skip to the next die. If the maximum number of cleans per wafer has not been exceeded the tester is preferably arranged to check whether the tester measurement tool is enabled for testing on the probe.

If the tester measurement tool is enabled for testing on the probe and the tester module requests testing, then testing is preformed on the probe using the tester measurement tool. Preferably the tester measurement tool tests all pins of the probe. If the per pin measurement of a characteristic of the pin exceeds a predetermined level the average measurement of a characteristic of the pins is checked. If the average pin characteristic measurement falls within a predetermined range the tester instructs the probe to move onto the next die. If the per pin measurement of the characteristic falls outside the predetermined range the tester triggers probe needle cleaning. If the average pin characteristic measurement falls outside the predetermined range the tester triggers the probe needle cleaning.

The characteristic of the pins that is measured may be pin voltage or resistance.

If the tester measurement tool is not enabled for testing a standard continuity test that is available on all testers may be used.

BRIEF DESCRIPTION OF DRAWINGS

The probe needle optimization system and method will be further described with reference to the accompanying drawings and without intending to be limiting wherein.

DETAILED DESCRIPTION

Figure 1:
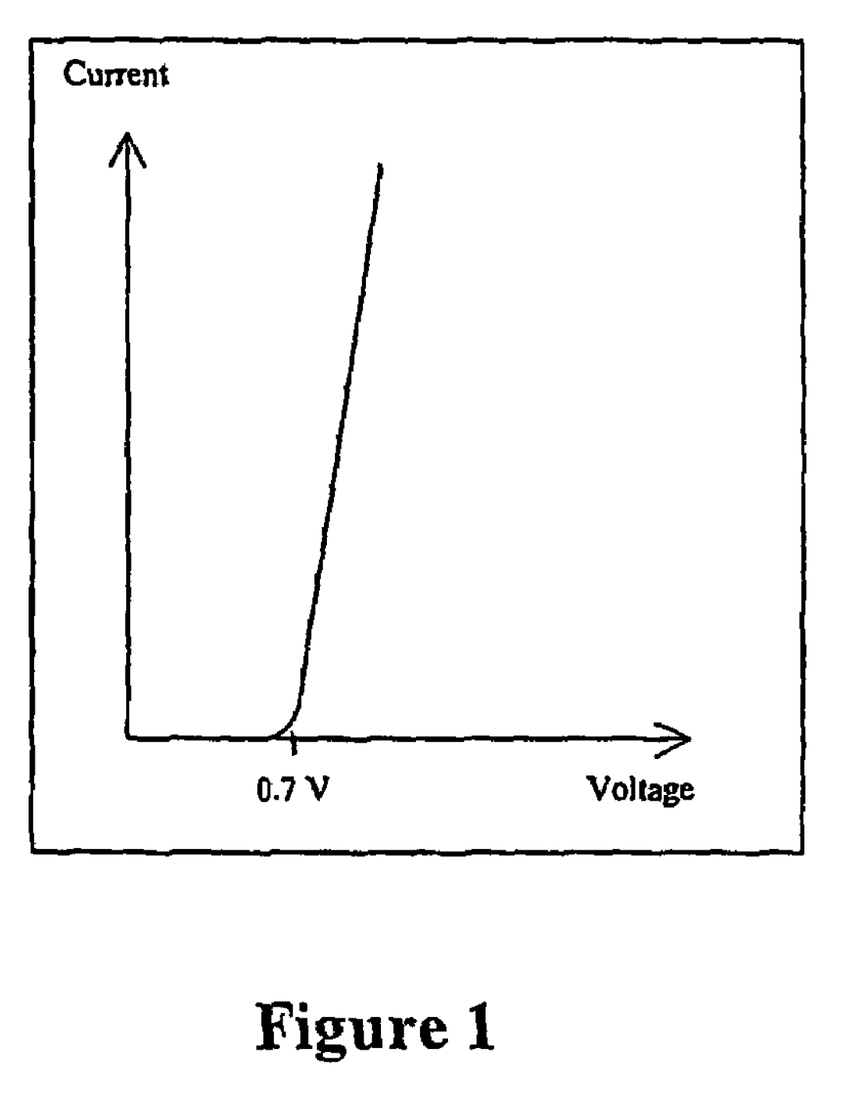
FIG. 1 shows a standard current/voltage curve for a diode.

Each needle on a probe card is connected to a probe pad protection diode. FIG. 1 shows the normal current versus voltage curve for a typical diode with a typical turn-on voltage of 0.7 V. If there is no resistance between the probe needle and the probe pad the shape of the current/voltage curve of the diode should remain the same. If there is resistive material between the probe needle and the probe pad the current/voltage curve of the diode will be altered. Therefore by looking at the current/voltage curve of the diode it can be established whether there is a build-up of material on the needles and therefore whether the needles require cleaning.

As stated above resistive material build-up on the probe needles can be one of two types, gradual build-up or sudden build-up.

Figure 3:
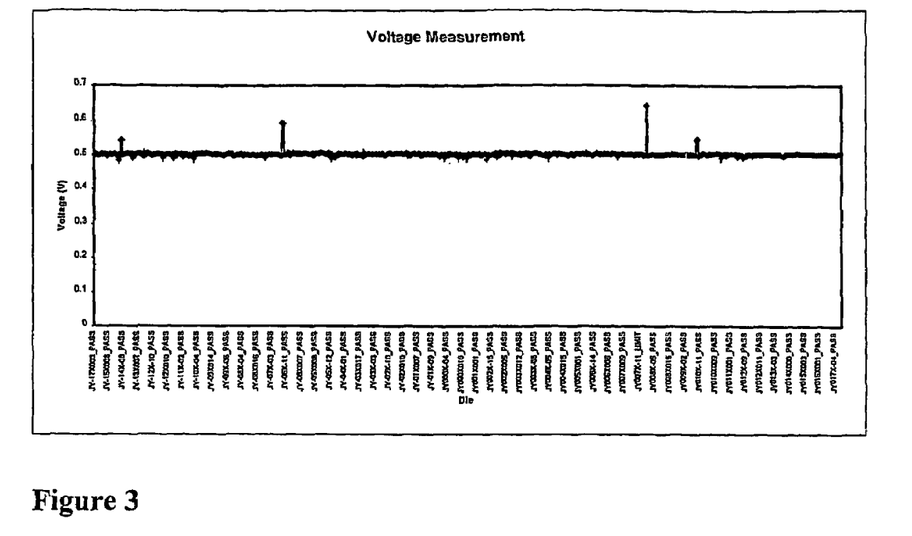
FIG. 3 shows the protection diode voltage measurement over a number of dies.

When a gradual build-up of material occurs the resistance of the diode increases slowly in a stable manner and is not always noticeable. FIG. 3 shows the voltage measurement over the diode for a number of die. It is impossible to visually tell from this graph whether there has been any gradual build-up of material.

Usually when gradual build-up occurs, the shape of the current/voltage curve resembles the normal current/voltage curve shown in FIG. 1 but with a slight shift to the right depending on the amount or resistance due to the build-up. The relationship of this resistance with the diode voltage is:

$$V = I(R_{diode} + R_{build-up})$$

The characteristic of sudden build-up that the needle may pick up during the probe process appears as spikes on the voltage measurement chart as shown in FIG. 3. In fact, the voltage measurement when sudden build-up occurs is similar to the behaviour of a bad diode. The relationship of resistance caused by sudden build-up with diode voltage is:

$$V = I(R_{diode} + R_{sudden}) \text{ where } R_{diode} << R_{sudden}$$

Figure 2:
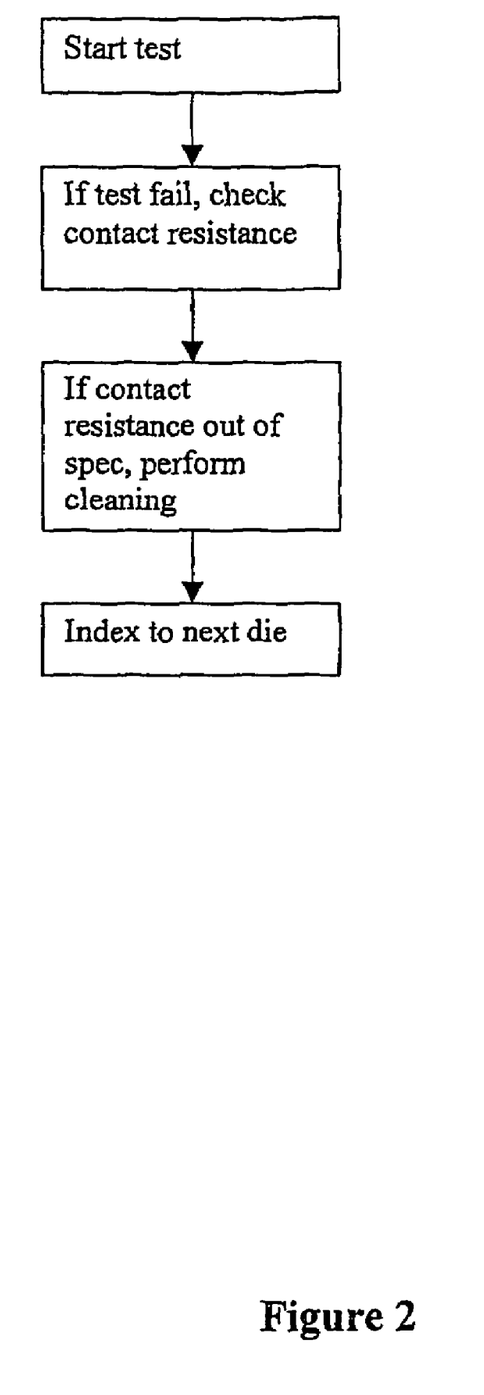
FIG. 2 is a flow diagram showing the basic needle cleaning information flow.

FIG. 2 shows the basic flow chart for needle cleaning. If a probe test on a die fails the contact resistance or voltage of the probe needles are checked. This check is performed by the checking the voltage of the probe needle diode and, in the preferred embodiment, determining the resistance from the voltage measurement. In an alternative embodiment the resistance is not determined from the voltage measurement. If the contact resistance or voltage is not with a predetermined range then the needles are cleaned. Following cleaning the probe card is then indexed to perform the probe test on the next die in the wafer.

In the preferred embodiment a tester module controls the probe. The tester module assesses whether the test on a die is a pass or a fail and checks the contact resistance if the test is a fail. The tester module also instructs the probe to move to the next die once the probe needles have been cleaned.

Figure 4:
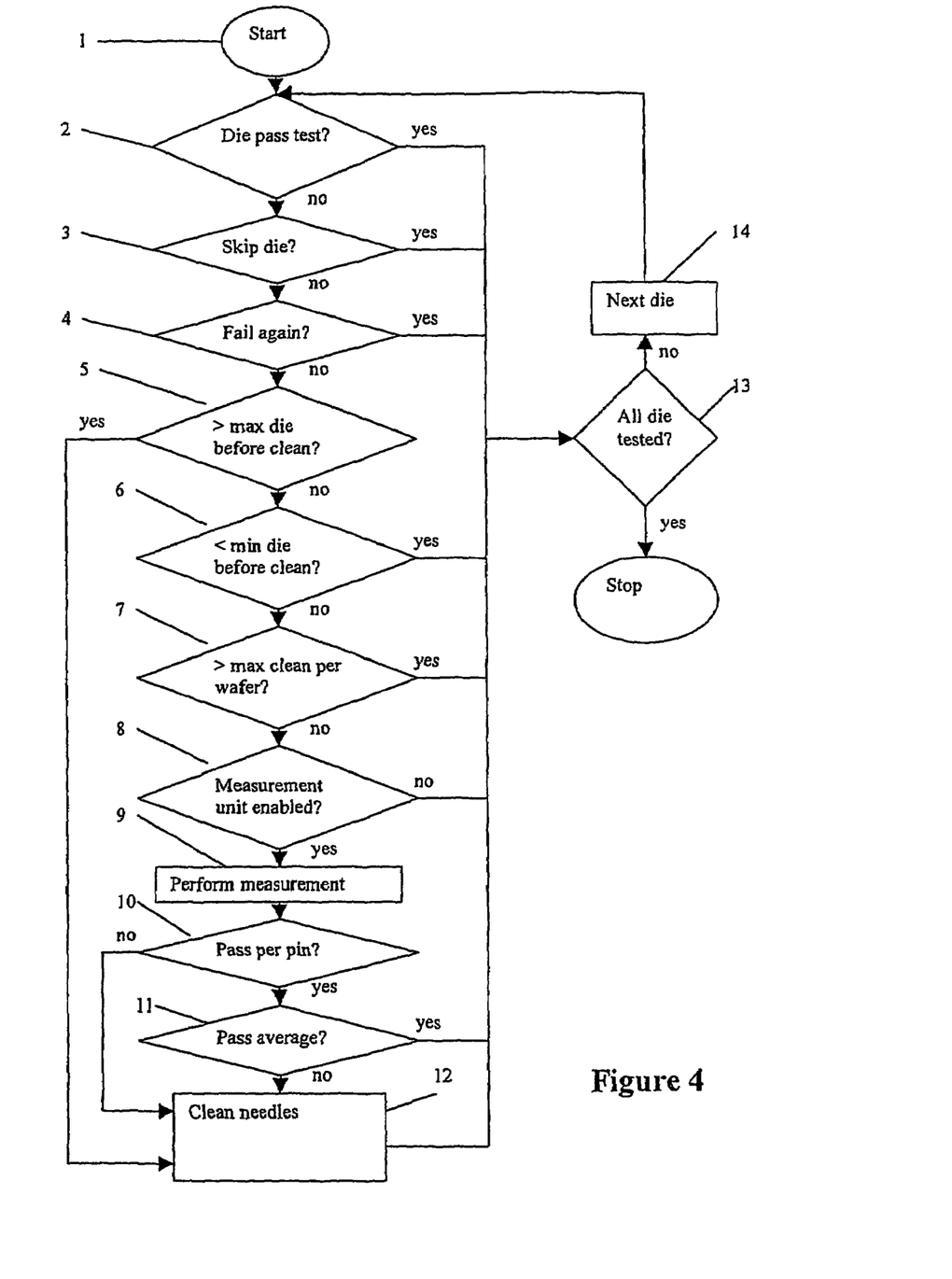
FIG. 4 is a flow chart for needle cleaning.

FIG. 4 is a flow chart showing in detail how the tester decides whether to clean the probe needles. It should be noted that a die might fail a probe test for a reason other than dirty probe needles. The tester takes this into account in the flow chart of FIG. 4.

In the start box 1 the tester may read in a profile for the wafer under test. This profile may include information about the wafer as well as a number of variables for the wafer such as the minimum number of dies that must be tested before the probe card may be cleaned, the maximum number of dies that can be tested before the probe card is cleaned, the maximum allowable number of probe card cleans that may occur per wafer under test. This information may be required during the testing program. The tester module keeps a count of how many needle cleanings have been performed for the current wafer and how many dies have been tested since the last needle clean.

The tester indexes the probe to begin testing on the wafer. The probe is arranged to test each die on the wafer. The probe testing begins at box 2. In this box the probe has tested a die and the tester module assesses whether the test results in a pass or fail for the die. If the test results in a pass the yes arrow is followed to box 13 where the tester module assesses whether all dies on the wafer have been tested. If all dies have been tested the test process stops. If some dies on the wafer haven't been tested the probe moves onto the next die and back to box 2 to test the next die.

If the die fails the test the no arrow is followed from box 2 to box 3. In this box the tester module queries whether the die should be skipped. Some dies on a wafer generally have low pass rates. For example, dies are generally square but the wafer itself may be circular. If the wafer is circular the dies at the edge of the wafer may not be complete and even if an edge die is complete it generally has a high fail rate. The wafer may also have alignment holes. These holes are used to prevent skipping during the masking process in wafer manufacture. Alignment dies are located on the edge of the alignment holes. As with edge dies these dies may not be complete and even if complete usually have a high fail rate.

In order to avoid unnecessary triggering of needle cleaning, low passing rate dies such as edge dies and alignment dies are skipped. Low passing rate dies are usually the edge dies and alignment block dies, which can be identified after testing several wafers with a simple script. Another method is to skip all edge dies regardless of the passing rate.

If the tester module determines the die is to be skipped the yes arrow is followed to blocks 13 and 14 to continue testing or end the test if all dies on the wafer have been tested.

If the tester module determines that the die is not to be skipped the no arrow is followed to block 4. In block 4 a second probe test is performed on the die. If the die fails this test the yes arrow is followed to blocks 13 and 14 to continue the testing process. If a die initially fail the probe test and then passes there may be a problem with the probe needles including a problem due to the build-up of resistive material on the probe needles.

In block 5 the tester module assesses whether the probe has exceeded the maximum number of die that can be tested before cleaning the probe needles. The maximum number of die to be tested before a clean is a fixed number set for cleaning of gradual build-up. This information is stored in the profile of the wafer under test. For example for a wafer 1000 may be used as a guide. Depending on the die sensitivity to contact resistance the number can be set lower. The sufficiency of this number can be checked by analysing cleaning frequency of the probe needles. The tester module may include a counter that counts the number of dies tested between needle cleanings. This counter is reset whenever the probe needles are cleaned.

If the maximum number of die that can be tested before cleaning has been exceeded the system follows the yes arrow from box 5 to box 12 and the tester triggers cleaning of the probe needles. Once the needles are cleaned the arrow is followed from box 12 to boxes 13 and 14 that lead to ending the testing or testing the next die.

If the maximum number of die that can be tested before cleaning has not been exceeded the no arrow is followed from box 5 to box 6.

In box 6 the tester module queries whether the counter of dies tested since the last clean is less than the number of minimum die before clean. The minimum number of die before clean is a limit set to a minimum gap between two needle cleanings. For example the limit may be set to 3. This means that if there were potentially five needle cleanings for 5 consecutive dies only at the first and fifth dies would the probe needles be cleaned. This setting is made based on this risk (potential number of dies affected by not cleaning the needles during this interval) and the setting for the maximum number of allowable cleans per wafer.

If the minimum number of dies before clean limit has not been reached the yes arrow is followed to boxes 13 and 14 to continue the testing process or end the test as necessary. If the minimum number of dies before clean limit has been reached the no arrow is followed to box 7.

At box 7 the tester module queries whether the maximum number of cleans per wafer has been exceeded. This limit is used for determining the maximum number of times the probe needles can be cleaned when testing each wafer. The limit is calculated using the recommended needle cleaning interval as supplied by the probe card vendor. For example, the recommended cleaning interval is usually every 200 die. The maximum number of clean per wafer can then be set using the following formula:

Total number of dies to test per wafer/200

For example, if a wafer contains 1000 dies, using the formula provided above the maximum number of cleans per wafer is 5. If the wafer contains 200 dies the maximum number of cleans per wafer is 1. If the total number of dies per wafer is not a multiple of 200 the output of the equation is rounded up to the nearest integer. This means that if the total number of dies in a wafer is less than 200 the maximum number of cleans per wafer would be set at 1.

If the maximum number of cleans per wafer has been exceeded the yes arrow is followed from box 7 to boxes 13 and 14 so that the next die may be tested or the testing process finished if all dies have been tested. If the maximum number of cleans per wafer has not been exceeded the no arrow is followed from box 7 to box 8.

In box 8 the tester module queries whether the tester measurement unit is enabled. The tester measurement unit is arranged to test the probe needles when instructed. If the tester measurement unit is not enabled the no arrow is followed to boxes 13 and 14 so that the next die may be tested or the testing process finished if all dies have been tested. If the tester measurement unit is enabled the yes arrow is followed to box 9. The tester measurement unit may be a precise measurement unit or a continuity tester or any other suitable device.

In box 9 the tester module instructs the measurement unit to perform resistance or voltage measurements on the needles of the probe. There are some parts of the probe device that are more sensitive to contact resistance. These parts can be listed for possible triggering of needle cleaning. The measurement unit is arranged to test the resistance or voltage of each needle used by the probe card in the test.

In order to measure the voltage across the needle (and, in the preferred embodiment, from there determine the resistance) a minimum current must be forced into the diode. For example in many devices 1 mA is sufficient to turn on the diode. Depending on the protection diode available a plus or minus sign should be used to indicate a ground or power supply diode. The minimum force current value may be stored in the probe reference file.

Usually there must be some protection required by the measurement unit and also the pads. Upper and lower clamp voltage levels are stored in the probe reference file. These values are set to avoid under and over-shooting of the voltage when the resistance is too big or too small.

A current range value can also be stored in the probe reference file. This value is set so that the measurement unit can perform a proper voltage measurement. For example the current range may be 1 mA, 1 µA, 1 A or 10 A depending on the hardware specification of the tester.

In the preferred embodiment the probe reference file also includes contact resistance values for the probe needles. These values may include high, mean and low limit for the contact resistance. The limits need not be precise and a loose limit calculation of ±40% of the mean is generally effective for detecting sudden resistance build-up on a probe needle. The corresponding increase in voltage is generally easily detectable. Another limit calculation is the statistical process control approach where the upper and lower limits are set as plus and minus three times the standard deviation of the mean resistance value.

In the preferred embodiment the probe reference file also includes upper and lower limits for the sum of the contact resistances on all probe needles. The upper and lower limits for the sum of contact resistances can be set at ±20% of the mean sum of resistances on the probe needles.

In the preferred embodiment the measurement unit tests the resistance of each needle on the probe card using the force current, lower and upper voltage levels and current range values from the probe reference file to set operating parameters for the resistance test. Each resistance value is stored by the tester module.

Once the needles have been tested in box 9 the tester module queries the per needle resistance measurement in box 10. Each needle resistance measurement is tested against the high and low limits stored in the probe reference folder. If any of the needle resistances falls outside the acceptable limit the no arrow is followed to box 12 and the tester triggers cleaning of the probe needles. If all the needle resistances fall within the acceptable limit the yes arrow is followed to box 11.

In box 11 the tester module queries whether the average resistance of probe needles falls within acceptable limits. This can be performed by either taking the average of the pin resistances and testing this against the stored resistance limits or by taking the sum of the resistances and comparing this to the stored sum limits. If the average pin resistance measurement falls within the acceptable limits the yes arrow is followed to boxes 13 and 14 so that the next die may be tested or the testing process finished if all dies have been tested. If the average pin resistance measurement falls outside the acceptable limits the no arrow is followed to box 12.

In an alternative embodiment the measurement unit tests the voltage of each needle on the probe card using the force current, lower and upper voltage levels and current range values from the probe reference file to set operating parameters for the voltage test. Each voltage value is stored by the tester module.

Once the needles have been tested in box 9 the tester module queries the per needle voltage measurement in box 10. Each needle voltage measurement is tested against the high and low limits stored in the probe reference folder. If any of the needle voltages falls outside the acceptable limit the no arrow is followed to box 12 and the tester triggers cleaning of the probe needles. If all the needle voltages fall within the acceptable limit the yes arrow is followed to box 11.

In box 11 the tester module queries whether the average voltage of probe needles falls within acceptable limits. This can be performed by either taking the average of the pin voltages and testing this against the stored voltage limits or by taking the sum of the voltages and comparing this to the stored sum limits. If the average pin voltage measurement falls within the acceptable limits the yes arrow is followed to boxes 13 and 14 so that the next die may be tested or the testing process finished if all dies have been tested. If the average pin voltage measurement falls outside the acceptable limits the no arrow is followed to box 12.

In box 12 the needles of the probe card are cleaned. Once the needles have been cleaned the tester module queries whether there are any more dies to be tested on the wafer in box 13 and instructs the probe to test the next die in box 14.

Figure 5:
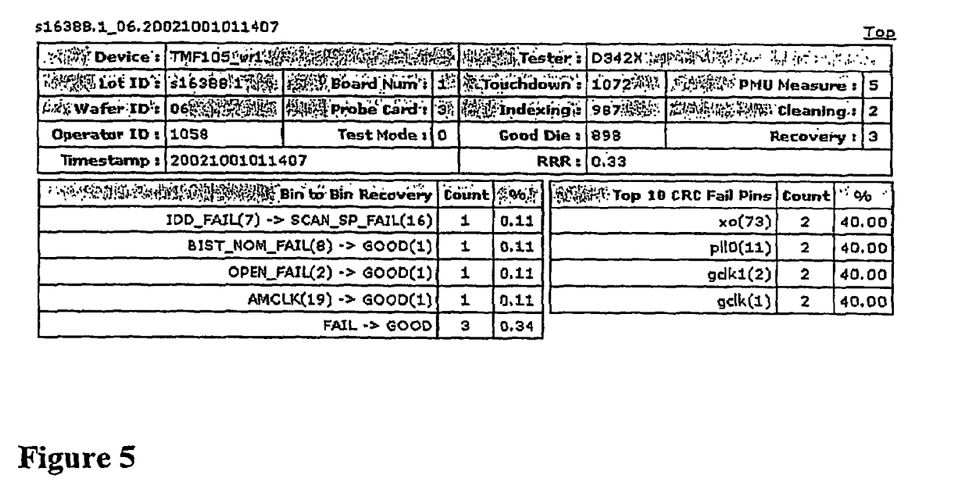
FIG. 5 shows a sample probing report.

In the preferred embodiment the tester module is arranged to store information relating to the probe needle cleaning performed during wafer testing. The tester module is further arranged to produce a report including the probe needle cleaning information. An example report is shown in FIG. 5. The right side of this report contains information regarding needle cleaning. The information in the report includes the number of needles that failed the resistance or voltage measurement test, the number of times the needles were cleaned during wafer testing, and information regarding possible localized contact problems in the needles. The localized contact problems will be confirmed if the same problems occur on subsequent wafers. This provides a guide for fixing the problem.

The advantages of the needle cleaning optimization system described above over a system that cleans probe needles after every set number of tests, include the ability to clean build-up resistance on needles efficiently, the ability to clean needles effectively when sudden resistance build-up occurs, low cleaning frequency, which leads to better maintenance, and longer probe needle life as well as improved productivity.

The foregoing describes the invention including preferred forms thereof. Alterations and modifications as will be obvious to those skilled in the art are intended to be incorporated in the scope hereof as defined by the accompanying claims.

The invention claimed is:

1. A method for optimizing cleaning of a probe card, the method comprising:
   using the probe card to test the functionality of dies on a wafer;
   when a die fails the probe test, and the probe reports failure to contact the pads of the die, assessing an electrical characteristic of the probe needles; and
   if the electrical characteristic of a probe needle is greater than a predetermined value, triggering probe needle cleaning;
   wherein a tester module controls the probe and probe module;
   wherein the tester module is arranged to assess whether the probe test is a pass or a fail;
   wherein if the test is a fail, the tester module is further arranged to determine whether or not to skip the die; the method further comprising re-probing the die if the die is not skipped; and
   wherein if the re-probe produces a pass result, the tester module is further arranged to assess whether the maximum number of dies per clean has been exceeded.

2. A method for optimizing cleaning of a probe card as claimed in claim 1 wherein the probe needle cleaning is performed by a separate device.

3. A method for optimizing cleaning of a probe card as claimed in claim 1 further including the step of cleaning the probe needles if the maximum number of dies per clean has been exceeded.

4. A method for optimizing cleaning of a probe card as claimed in claim 1 wherein if the maximum number of dies per clean has not been exceeded, the tester module further includes the step of assessing whether the probe is within the minimum number of dies before clean.

5. A method for optimizing cleaning of a probe card as claimed in claim 4 wherein if the probe is within the minimum number of dies before a clean, the tester module further includes the step of instructing the probe to skip to the next die.

6. A method for optimizing cleaning of a probe card as claimed in claim 4 wherein if the probe is above the minimum number of dies before a clean, the tester module further includes the step of assessing whether the maximum number of cleans per wafer has been exceeded.

7. A method for optimizing cleaning of a probe card as claimed in claim 6 wherein if the maximum number of cleans per wafer has been exceeded, the tester module includes the step of instructing the probe to skip to the next die.

8. A method for optimizing cleaning of a probe card as claimed in claim 6 wherein if the maximum number of cleans per wafer has not been exceeded, the tester module further includes the step of checking whether a tester measurement tool is enabled for testing on the probe.

9. A method for optimizing cleaning of a probe card as claimed in claim 8 wherein if the tester measurement tool is enabled for testing on the probe, the tester module includes the step of testing the probe using the tester measurement tool.

10. A method for optimizing cleaning of a probe card as claimed in claim 9 wherein the tester measurement tool tests a characteristic of all pins of the probe.

11. A method for optimizing cleaning of a probe card as claimed in claim 10 wherein if the per pin measurement of a characteristic of the pins passes a predetermined level, the tester module further includes the step of checking the average of the characteristic of the pin measurements.

12. A method for optimizing cleaning of a probe card as claimed in claim 11 wherein if the average pin measurement of the characteristic falls within a predetermined range the tester module is further arranged to instruct the probe to move onto the next die.

13. A method for optimizing cleaning of a probe card as claimed in claim 11 wherein if the average pin measurement of the characteristic falls outside the predetermined range the tester module further includes the step of triggering the probe needle cleaning.

14. A method for optimizing cleaning of a probe card as claimed in claim 10 wherein if the per pin measurement of the characteristic falls outside the predetermined range the tester module further includes the step of triggering probe needle cleaning.

15. A method for optimizing cleaning of a probe card as claimed in claim 9 wherein if the tester measurement tool is not enabled for testing, the tester module further includes the step of using a standard continuity test.

16. A method for optimizing cleaning of a probe card as claimed in claim 1 wherein the characteristic is resistance.

17. A method for optimizing cleaning of a probe card as claimed in claim 1 wherein the characteristic is voltage.

18. A system for optimizing cleaning of a probe card, the system comprising:
   a probe card arranged to test the functionality of dies on a wafer; when a die fails the probe test, the probe card is further arranged to report failures to contact the pads of the die to a tester module, the tester module arranged to assess an electrical characteristic of the probe needles;

and if the electrical characteristic of a probe needle is greater than a predetermined value the tester module is arranged to trigger probe needle cleaning;

wherein a tester module controls the probe and probe module;

wherein the tester module is arranged to assess whether the probe test is a pass or a fail;

wherein if the test is a fail, the tester module is further arranged to determine whether or not to skip the die;

wherein the tester module is arranged to instruct the probe to re-probe the die if the die is not skipped; and wherein if the re-probe produces a pass result, the tester module is further arranged to assess whether the maximum number of dies per clean has been exceeded.

19. A system for optimizing cleaning of a probe card as claimed in claim 18 further including a separate device arranged to perform the probe needle cleaning.

20. A system for optimizing cleaning of a probe card as claimed in claim 18 wherein the tester module is arranged to instruct cleaning the probe needles if the maximum number of dies per clean has been exceeded.

21. A system for optimizing cleaning of a probe card as claimed in claim 18 wherein if the maximum number of dies per clean has not been exceeded, the tester module is further arranged to assess whether the probe is within the minimum number of dies before clean.

22. A system for optimizing cleaning of a probe card as claimed in claim 21 wherein if the probe is within the minimum number of dies before a clean, the tester module is further arranged to instruct the probe to skip to the next die.

23. A system for optimizing cleaning of a probe card as claimed in claim 21 wherein if the probe is above the minimum number of dies before a clean, the tester module is further arranged to assess whether the maximum number of cleans per wafer has been exceeded.

24. A system for optimizing cleaning of a probe card as claimed in claim 23 wherein if the maximum number of cleans per wafer has been exceeded, the tester module is further arranged to instruct the probe to skip to the next die.

25. A system for optimizing cleaning of a probe card as claimed in claim 23 wherein if the maximum number of cleans per wafer has not been exceeded, the tester module is further arranged to check whether a tester measurement tool is enabled for testing on the probe.

26. A system for optimizing cleaning of a probe card as claimed in claim 25 wherein if the tester measurement tool is enabled for testing on the probe, the tester module is further arranged to test the probe using the tester measurement tool.

27. A system for optimizing cleaning of a probe card as claimed in claim 26 wherein the tester measurement tool is arranged to test a characteristic of all pins of the probe.

28. A system for optimizing cleaning of a probe card as claimed in claim 27 wherein if the per pin measurement of a characteristic of the pins passes a predetermined level, the tester module is further arranged to assess the average of the characteristic of the pin measurements.

29. A system for optimizing cleaning of a probe card as claimed in claim 28 wherein if the average pin measurement of the characteristic falls within a predetermined range the tester module is further arranged to instruct the probe to move onto the next die.

30. A system for optimizing cleaning of a probe card as claimed in claim 28 wherein if the average pin measurement of the characteristic falls outside the predetermined range the tester module is further arranged to trigger the probe needle cleaning.

31. A system for optimizing cleaning of a probe card as claimed in claim 27 wherein if the per pin measurement of the characteristic falls outside the predetermined range the tester module is further arranged to trigger probe needle cleaning.

32. A system for optimizing cleaning of a probe card as claimed in claim 26 wherein if the tester measurement tool is not enabled for testing, the tester module is further arranged to use a standard continuity test.

33. A system for optimizing cleaning of a probe card as claimed in claim 18 wherein the characteristic is resistance.

34. A system for optimizing cleaning of a probe card as claimed in claim 18 wherein the characteristic is voltage.

* * * * *